United States Patent [19]

Hiratsuka et al.

[11] Patent Number: 4,837,610
[45] Date of Patent: Jun. 6, 1989

[54] INSULATION FILM FOR A SEMICONDUCTOR DEVICE

[75] Inventors: Hachiro Hiratsuka, Yokohama; Yoshiaki Matsushita, Kawasaki; Shintaro Yoshii, Tokyo, all of Japan

[73] Assignee: Kabushiki Kaisha Toshiba, Kawasaki, Japan

[21] Appl. No.: 147,605

[22] Filed: Jan. 22, 1988

Related U.S. Application Data

[63] Continuation of Ser. No. 910,852, Sep. 24, 1986, abandoned, Continuation of Ser. No. 677,162, Nov. 30, 1984, abandoned.

[30] Foreign Application Priority Data

Mar. 1, 1984 [JP] Japan .................. 59-39509

[51] Int. Cl.$^4$ ............ H01L 29/78; H01L 27/02; H01L 29/34
[52] U.S. Cl. ................... 357/52; 357/23.15; 357/41
[58] Field of Search ............ 357/52, 23.15, 10, 42; 437/238-240

[56] References Cited

U.S. PATENT DOCUMENTS

| | | | |
|---|---|---|---|
| 3,547,717 | 12/1970 | Lindmayer | 357/23.15 |
| 3,627,647 | 12/1971 | Reuter et al. | 357/23.15 |
| 3,632,438 | 1/1972 | Carlsson et al. | 437/240 |
| 3,882,530 | 5/1975 | Danchenko | 357/23.15 |
| 3,945,031 | 3/1976 | Kahng et al. | 357/52 |
| 3,999,209 | 12/1976 | Wrigley et al. | 357/52 |
| 4,270,236 | 5/1981 | Toyokura et al. | 357/65 |
| 4,297,782 | 11/1981 | Ito | 437/20 |
| 4,443,930 | 4/1984 | Hwang et al. | 357/67 |
| 4,519,849 | 5/1985 | Korsh et al. | 357/91 |
| 4,621,277 | 11/1986 | Ito et al. | 357/23.15 |

OTHER PUBLICATIONS

S. M. Sze, *Semiconductor Devices Physics and Technology*, John Wiley & Sons, New York, (1985), p. 344.
F. Montillo et al., "High-Temperature Annealing of Oxidized Silicon Surfaces", *Journal of the Electrochemical Society, Solid State Science*, vol. 118, No. 9, (Sep. 1971) pp. 1463-1468.
B. E. Deal et al., "Characteristics of the Surface-State Charge (Qss) of Thermally Oxidized Silicon", *Journal of the Electrochemical Society, Solid State Science*, vol. 114, No. 3 (Mar. 1967) pp. 266-274.
E. A. Irene, "Silicon Oxidation Studies: Some Aspects of the Initial Oxidation Regeme", *J. Electrochem. Soc.*, vol. 125, pp. 1708-1714, Oct. 1978.
K. Yamabe et al., "Thickness Dependence of Dielectric Breakdown Failure of Thermal SiO$_2$ Films", 21st Annual Proc. Reliability Phys. 1983, pp. 184-190.
J. Steinbert, "Dual HCl Thin Gate Oxidation Process", *J. Electrochem. Society Solid-State Science and Technology*, pp. 1778-1782, (Aug. 1982) vol. 129.

*Primary Examiner*—J. Carroll
*Attorney, Agent, or Firm*—Finnegan, Henderson, Farabow, Garrett, & Dunner

[57] ABSTRACT

A semiconductor device is provided having as an insulating oxide film a silicon oxide film containing a metal, such as iron or chromium, of an average concentration of $1 \times 10^{16}$ atoms/cm$^3$ to $1 \times 10^{19}$ atoms/cm$^3$ which can be readily trapped therein.

2 Claims, 2 Drawing Sheets

INSULATION FILM FOR A SEMICONDUCTOR DEVICE

This application is a continuation of application Ser. No. 910,852, filed Sept. 24, 1986, abandoned, which is a continuation of application Ser. No. 677,162, filed Nov. 30, 1984, now abandoned.

BACKGROUND OF THE INVENTION

This invention relates to a semiconductor device having a silicon oxide film as an insulating oxide film.

A thin silicon oxide film which is formed on the surface of a silicon wafer plays a fundamentally important part in the fabrication of a device such as an IC and an LSI device. In order to improve the following fundamental characteristics of the semiconductor device in a gate oxidation step, i.e., one of the important steps of thermal oxidation, such as (1) the inclusion of an impurity such as mobile metal ions in the silicon oxide film, (2) lowering the level of silicon oxide film to silicon interface, (3) a high dielectric breakdown strength and a small variation in an interface level $N_{SS}$, (4) a uniform thickness, greater efforts have been made to purify a silicon wafer and an oxidating furnace.

It is evident that, of the impurity ions in the silicon oxide film as indicated by (1), the alkali metal ions such as sodium (Na) and potassium (K) act as mobile metal ions in the silicon oxide film to degrade the characteristics of the silicon oxide film.

The behavior of metals, other than the alkali metal, in the silicon oxide film is unclear on numerous points, There is a possibility that those elements taken in the silicon oxide such as iron (Fe), aluminium (Al), copper (Cu), chromium (Cr), nickel (Ni) or zinc (Zn) will improve the characteristics of the silicon oxide film.

SUMMARY OF THE INVENTION

It is accordingly an object of this invention to provide a semiconductor device adapted to improve the characteristics of a silicon oxide film by introducing a specific metal element thereinto.

The inventors have conducted experiments to clarify the relation of an impurity element in a silicon oxide film to the characteristics of the silicon oxide film. As a result, it has been found that a silicon oxide film containing a metal element, such as iron, of a concentration of $1 \times 10^{16}$ atoms/cm³ to $1 \times 10^{19}$ atoms/cm³ which can be trapped therein is excellent in its breakdown voltage characteristic over a silicon oxide film containing the above-mentioned metal of a concentration less than $1 \times 10^{16}$ atoms/cm³ or in excess of $1 \times 10^{19}$ atoms/cm³.

According to one embodiment of this invention, therefore, there is provided a semiconductor device which has as an insulating oxide film a silicon oxide film containing such a metal which can be readily trapped therein.

By introducing a specific metal element thereinto, this arrangement can implement an improved breakdown voltage characteristic of the silicon oxide film.

DETAILED DESCRIPTION OF THE PREFERRED EMBODIMENTS

Figure 1:
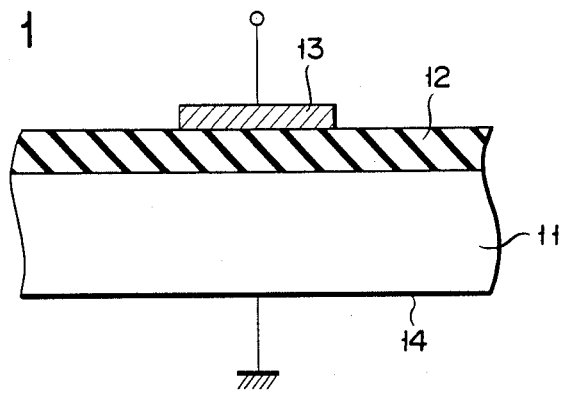
FIG. 1 is a cross-sectional view showing a semiconductor device according to one embodiment of this invention.

FIG. 1 is a diagrammatic view in cross section showing a semiconductor device (an MOS device) according to one embodiment of this invention.

An N-type silicon wafer 11 of a resistivity of 3 Ω.cm to 6 Ω.cm was thermally oxidized in an oxygen atmosphere at 900° to 1,000° C. to form a 300 Å-thick silicon oxide film 12. At this time, the silicon wafer was thermally oxidized in an atmosphere of a Fe-containing oxygen gas in an oxidizing furnace to permit Fe to be trapped in the silicon oxide film 12 at a varying concentration level. In order to permit Fe to be contained in an oxygen gas, it is only necessary that the oxygen gas be passed over a standard solution whose Fe concentration is on the order of 1 ppm to 0.1 ppm.

Then, an Al-Si (aluminium-silicon alloy) electrode 13 was formed on the silicon oxide film 12. In the MOS diode so formed, an external voltage was applied between an ohmic contact surface 14 on the reverse surface thereof and the Al-Si electrode 13, measuring the breakdown voltage of the silicon oxide film 12.

At the same time, a conventional MOS diode was formed having an Fe-free silicon oxide film, and the breakdown voltage of the silicon oxide film in the conventional MOS diode was measured under the same condition as in the MOS diode of this invention.

Figure 2:
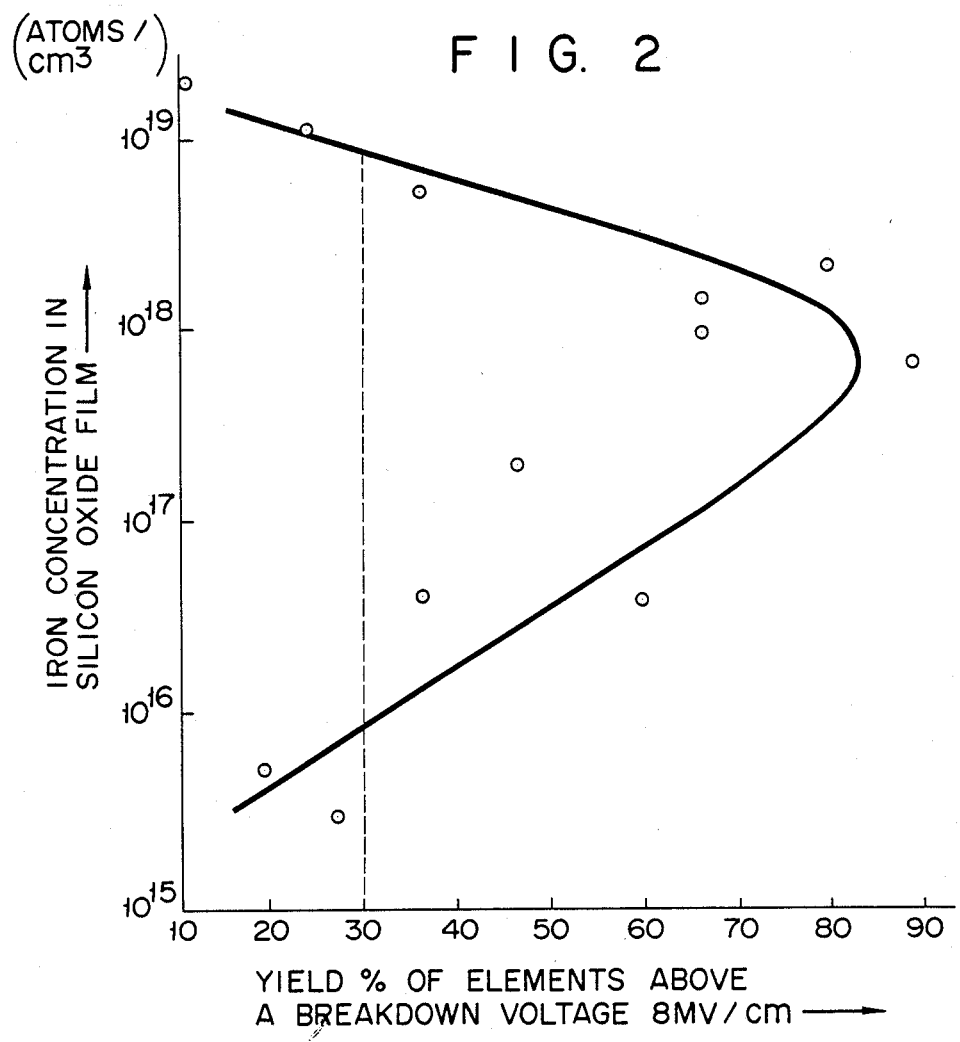
FIG. 2 is a graph showing a relation of the concentration of iron in a silicon oxide film to a yield in an element having a breakdown voltage of above 8 MV/cm.

FIG. 2 shows a result of this measurement, showing a yield (i.e., no incidence of breakdowns) in the MOS diode having a breakdown voltage of 8 MV/cm.

From this graph it has been found that the breakdown voltage of the Fe-containing silicon oxide film is improved with a peak of an average concentration of Fe in the silicon oxide film located in the neighborhood of $1 \times 10^{18}$ atoms/cm³. It has also been found that a yield of above 30% is obtained when Fe is introduced in a concentration range of $1 \times 10^{16}$ atoms/cm³ to $1 \times 10^{19}$ atoms/cm³ and then an external voltage is applied so as to permit an electric field strength in the silicon oxide film to be 8 MV/cm³.

Figure 3:
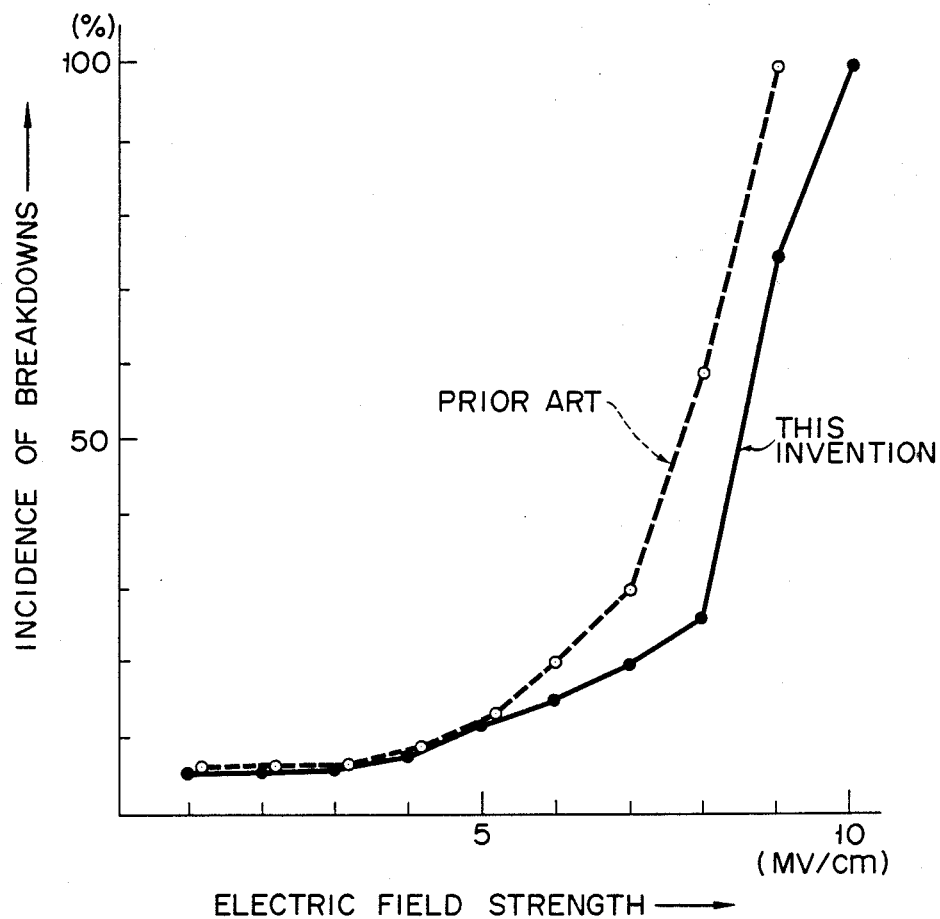
FIG. 3 is a graph showing a relation of the breakdown voltage to an incidence of breakdowns in the semiconductor device of this invention and in a conventional semiconductor device.

FIG. 3 is a graph showing a comparison in breakdown voltage between the conventional MOS diode formed with no introduction of Fe and the MOS diode with the silicon oxide film containing an Fe concentration of $1 \times 10^{16}$ atoms/cm³ to $1 \times 10^{19}$ atoms/cm³. As will be appreciated from the graph, a reduced incidence of breakdowns is prominent in a relatively high electric field strength in the silicon oxide film which is produced particularly by the applications of an external voltage. For the electric field strength of above 8 MV/cm³, a yield of about 74% is obtained in the embodiment of this invention against a yield of about 41% in the conventional MOS diode.

The inventors have also conducted experiments in connection with Cr in the same way as with Fe. From this it has been found that, when Cr is introduced in the silicon oxide film to have an average concentration of $1 \times 10^{16}$ atoms/cm³ to $1 \times 10^{19}$ atoms/cm³, the breakdown voltage characteristic of the silicon oxide film is improved.

Although in the above-mentioned embodiment of this invention the MOS diode has been explained in connection with, for example, the MOS diode, this invention is not restricted to this embodiment. This invention can also been applied to other semiconductor devices having such a silicon oxide film. Even in the case, the breakdown voltage characteristic of such other semiconductor devices can also be improved.

As set out above, according to this invention it is possible to provide a semiconductor device having a silicon oxide film with an improved breakdown voltage characteristic. With the recent tendency toward the high integration density of ICs, a thinner silicon oxide film has been widely used as an insulating film and thus it is required that the insulating oxide film have a high breakdown voltage characteristic.

The semiconductor device of this invention adequately answers such a requirement.

What is claimed is:

1. A semiconductor device, comprising:
   (a) a semiconductor substrate;
   (b) a silicon oxide gate insulation film formed on the semiconductor substrate;
   (c) a gate electrode formed on the gate insulation film;
   (d) iron present in the gate insulation film in a concentration effective to improve the insulation breakdown resistance of the gate insulation film positioned between the semiconductor substrate and the gate electrode, the iron being contained in the gate insulation film in a concentration range of between $1 \times 10^{16}$ atoms/cm$^3$ and $1 \times 10^{19}$ atoms/cm$^3$; and
   (e) a means for applying voltage between the gate electrode and the semiconductor substrate.

2. The semiconductor device of claim 2, wherein the iron concentration in the gate insulation film is about $1 \times 10^{18}$ atoms/cm$^3$.

* * * * *